(12) United States Patent
Mi et al.

(10) Patent No.: US 11,929,383 B2
(45) Date of Patent: Mar. 12, 2024

(54) INTRA-PIXEL CROSSTALK REDUCTION FOR A MULTI-MODE IMAGE SENSOR

(71) Applicant: Sony Semiconductor Solutions Corporation, Kanagawa (JP)

(72) Inventors: Hongyi Mi, Victor, NY (US);
Frederick T. Brady, Webster, NY (US); Sungin Han, Pittsford, NY (US);
Pooria Mostafalu, Penfield, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 159 days.

(21) Appl. No.: 17/702,474

(22) Filed: Mar. 23, 2022

(65) Prior Publication Data

US 2023/0326952 A1 Oct. 12, 2023

(51) Int. Cl.
*H01L 27/146* (2006.01)
*H04N 25/60* (2023.01)

(52) U.S. Cl.
CPC .. *H01L 27/14643* (2013.01); *H01L 27/14612* (2013.01); *H01L 27/14621* (2013.01); *H01L 27/14636* (2013.01); *H01L 27/14689* (2013.01); *H04N 25/60* (2023.01)

(58) Field of Classification Search
CPC ......... H01L 27/14643; H01L 27/14612; H01L 27/14621; H01L 27/14636; H01L 27/14689; H04N 25/60; H04N 25/79
See application file for complete search history.

(56) References Cited

U.S. PATENT DOCUMENTS

2021/0074745 A1  3/2021  Mi et al.
2022/0285410 A1*  9/2022  Takada ............. H01L 27/14623

FOREIGN PATENT DOCUMENTS

WO  2016163240 A1  10/2016
WO  2021112151 A1  6/2021

OTHER PUBLICATIONS

International Search Report dated Jun. 6, 2023 for corresponding International Application No. PCT/IB2023/052469.

* cited by examiner

*Primary Examiner* — Nicholas G Giles
(74) *Attorney, Agent, or Firm* — Michael Best & Friedrich LLP

(57) ABSTRACT

A pixelated image sensor capable of simultaneously supporting an EVS mode and an image-frame capture mode of operation. An individual pixel of the sensor comprises two distinct sets of subpixels involved in the two modes, respectively, and at least two corresponding, functionally different and independent electrical circuits. The metal interconnect structure of the image-sensor IC is implemented using a wiring topology in which spatial overlap between the wirings of the two electrical circuits is optimized (e.g., minimized) to reduce inter-circuit crosstalk when the two circuits are active at the same time. Such wiring topology may be beneficial, e.g., due to the resulting improvements in the image quality for both operating modes.

20 Claims, 10 Drawing Sheets

INTRA-PIXEL CROSSTALK REDUCTION FOR A MULTI-MODE IMAGE SENSOR

BACKGROUND

Field

Various example embodiments relate to imaging apparatus and, more specifically but not exclusively, to pixelated image sensors capable of supporting two or more modes of operation.

Description of the Related Art

This section introduces aspects that may help facilitate a better understanding of the disclosure. Accordingly, the statements of this section are to be read in this light and are not to be understood as admissions about what is in the prior art or what is not in the prior art.

Image sensors are used in various electronic imaging devices and systems, such as digital cameras, smartphones, medical imaging equipment, night vision equipment, etc. Two main types of image sensors used in such imaging devices are the charge-coupled-device (CCD) sensors and the active-pixel, complementary metal-oxide-semiconductor (CMOS) sensors. In addition to the primary task of light collection, CMOS image sensors may typically provide several processing and/or control functions directly in the sensor's integrated circuit (IC) and/or IC assembly. For example, functional circuits of some CMOS sensors may enable one or more of: timing and exposure control, analog-to-digital conversion, shuttering, white balance, gain adjustment, and initial signal and/or image processing. Proper integration of such functional circuits into the sensor is typically needed for optimal performance.

SUMMARY OF SOME SPECIFIC EMBODIMENTS

Disclosed herein are various embodiments of a pixelated image sensor capable of simultaneously supporting an event-based vision sensor (EVS) mode and an image-frame capture mode of operation. An individual pixel of the sensor comprises two distinct sets of subpixels involved in the two modes, respectively, and at least two corresponding, functionally different and independent electrical circuits. The metal interconnect structure of the image-sensor IC is implemented using a wiring topology in which spatial overlap between the wirings of the two electrical circuits is optimized (e.g., minimized) to reduce inter-circuit crosstalk when the two circuits are active at the same time. Such wiring topology may be beneficial, e.g., due to the resulting improvements in the image quality for both operating modes.

According to an example embodiment, provided is an apparatus, comprising a first electronic chip having an array of photosensitive pixels along a light-receiving surface thereof, wherein a pixel of the array comprises: one or more first photodiodes and one or more second photodiodes; first and second transistors; and an interconnect structure vertically below the first and second photodiodes and the first and second transistors, the interconnect structure including first electrical conductors interconnecting the one or more first photodiodes and the first transistors to form a first electrical circuit and further including second electrical conductors interconnecting the one or more second photodiodes and the second transistors to form a second electrical circuit, the first and second electrical circuits being functionally different and independent from each other; wherein the first electrical conductors are arranged substantially in a portion of the interconnect structure vertically below a first area of the light-receiving surface in the pixel; and wherein the second electrical conductors are arranged substantially in a portion of the interconnect structure vertically below a second area of the light-receiving surface in the pixel, the second area non-overlapping with the first area.

According to another example embodiment, provided is a manufacturing method, comprising the steps of: (A) fabricating an electronic chip having an array of photosensitive pixels along a light-receiving surface thereof, wherein a pixel of the array comprises: one or more first photodiodes and one or more second photodiodes; and first and second transistors; and (B) forming an interconnect structure vertically below the first and second photodiodes and the first and second transistors, the interconnect structure including first electrical conductors interconnecting the one or more first photodiodes and the first transistors to form a first electrical circuit and further including second electrical conductors interconnecting the one or more second photodiodes and the second transistors to form a second electrical circuit, the first and second electrical circuits being functionally different and independent from each other, wherein the forming comprises: (B1) arranging the first electrical conductors substantially in a portion of the interconnect structure vertically below a first area of the light-receiving surface in the pixel; and (B2) arranging the second electrical conductors substantially in a portion of the interconnect structure vertically below a second area of the light-receiving surface in the pixel, the second area non-overlapping with the first area.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
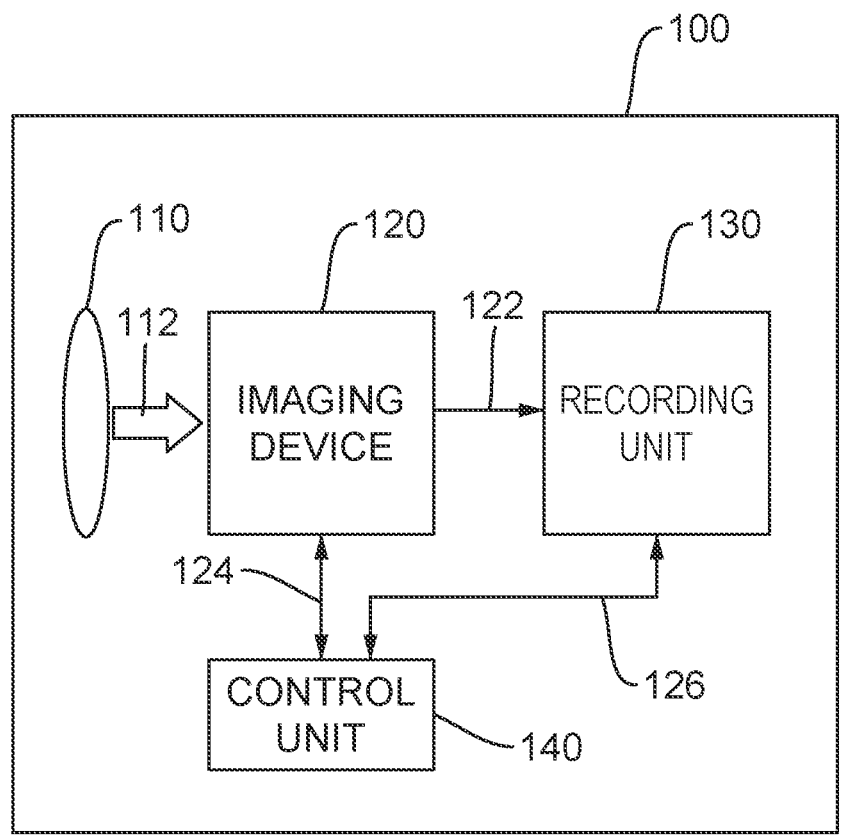
FIG. 1 shows a block diagram of an imaging system according to an embodiment.

FIG. 1 shows a block diagram of an imaging system 100 according to an embodiment. System 100 can be used, e.g., in a camera of an industrial robot or autonomous vehicle. Other uses of system 100 may also be contemplated.

As shown, system 100 comprises an imaging lens 110, an electronic imaging device 120, a recording unit 130, and a control unit 140. In operation, lens 110 directs incident light 112 to form an image of the corresponding object or scene on a light-receiving surface of imaging device 120. Such light-receiving surface typically comprises a two-dimensional array of photodetectors (not explicitly shown in FIG. 1; e.g., see FIG. 7) configured to perform optical-to-electrical conversion to generate electrical signals representing the image. In an example embodiment, imaging device 120 may also operate to apply some signal processing to the electrical signals prior to outputting the corresponding digital signals 122 to recording unit 130, e.g., for storage in a memory thereof. Such memory may comprise, e.g., a solid-state memory device or other suitable forms of memory. Control unit 140 may use control signals 124, 126 to control and coordinate various operations and/or functions performed by imaging device 120 and recording unit 130.

Figure 2:
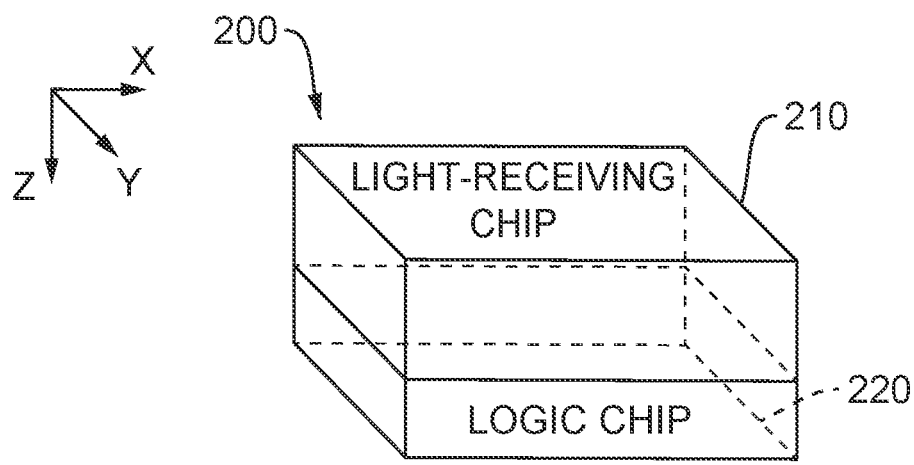
FIG. 2 shows a simplified three-dimensional perspective view of an IC assembly that can be used in the imaging system of FIG. 1 according to an embodiment.

FIG. 2 shows a simplified three-dimensional perspective view of an integrated circuit (IC) assembly 200 that can be used in imaging device 120 (FIG. 1) according to an embodiment. Assembly 200 comprises a light-receiving chip 210 and a logic chip 220 arranged in a vertical stack, as indicated in FIG. 2.

As used herein, the term "stack" refers to an orderly arrangement of packaged or non-packaged dies in which main planes of the stacked dies face and are near each other. The facing dies or chips may be electrically connected, e.g., using patterned conducting (such as metal) layers, ball-grid arrays, solder bumps, wire bonds, etc. In some such embodiments, the dies or chips of a stack can be mounted on a mechanical carrier in an orientation in which the main planes of the stacked dies are parallel to each other and/or to the main plane of the mechanical carrier. In some such embodiments, one of the dies or chips of the stack may function as the mechanical carrier. In some embodiments, individual ICs of the stack may include any combination of one or more respective substrates, one or more redistribution layers (RDLs), one or more interposers, one or more laminate plates, etc.

Herein, a "main plane" of an object, such as a die, a substrate, or an IC, is a plane parallel to a substantially planar surface thereof that has about the largest area among exterior surfaces of the object. This substantially planar surface may be referred to as a main surface. The exterior surfaces of the object that have one relatively large size, e.g., length, but are of much smaller area, e.g., less than one half of the main-surface area, are typically referred to as the edges of the object.

Herein, the term "vertical" refers to a direction that is approximately orthogonal to a main plane of light-receiving chip 210 or logic chip 220. In FIG. 2, a vertical direction is parallel to the Z-coordinate axis. The term "horizontal" refers to a direction that is approximately parallel to said main plane. In FIG. 2, a horizontal plane is parallel to the XY-coordinate plane.

In some embodiments, chips 210 and 220 may be flip-chip bonded using direct joining, in which the facing surfaces of the chips are planarized, and the chips are laminated together to form assembly 200. In some other embodiments, chips 210 and 220 may be flip-chip bonded using Cu-to-Cu joining, in which copper (Cu) pads formed on the facing surfaces of the chips are bonded to provide electrical connections between the chips in assembly 200. In some alternative embodiments, other suitable chip-stacking techniques may also be used.

Figure 3:
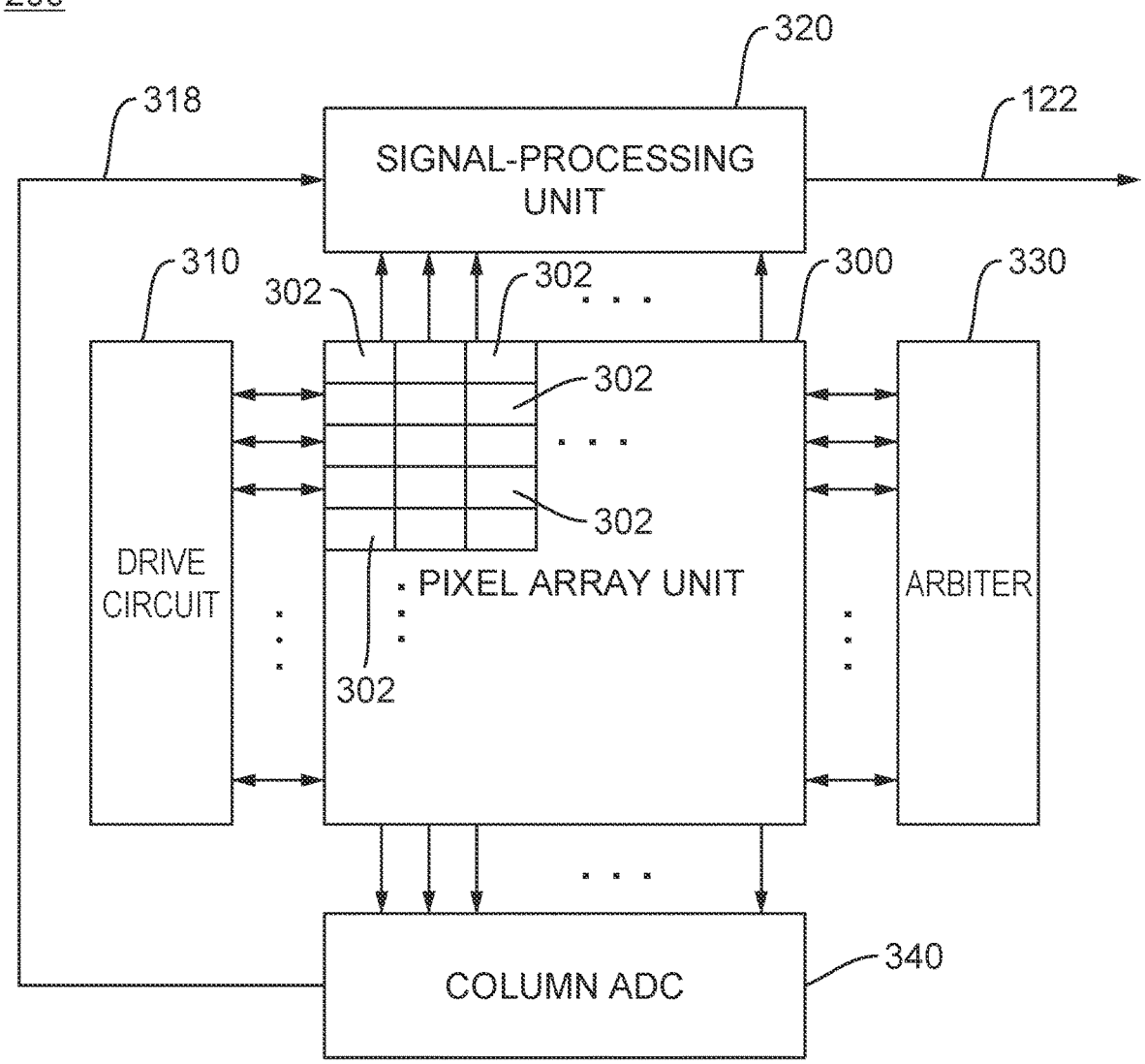
FIG. 3 shows a circuit block diagram of the IC assembly of FIG. 2 according to an embodiment.

FIG. 3 shows a circuit block diagram of assembly 200 (FIG. 2) according to an embodiment. As shown in FIG. 3, assembly 200 comprises a pixel array unit 300, a drive circuit 310, a signal-processing unit 320, an arbiter 330, and a column analog-to-digital converter (ADC) circuit 340. In an example embodiment, light-receiving chip 210 (FIG. 2) may typically include pixel array unit 300, whereas logic chip 220 may typically include drive circuit 310 and arbiter 330. In an alternative embodiment, some other practically feasible and/or functionally suitable partition of circuits 310, 320, 330, and 340 between chips 210 and 220 may also be implemented.

Pixel array unit 300 comprises a plurality of pixels 302 arranged in a two-dimensional matrix array, wherein individual pixels 302 are arranged in mutually orthogonal rows and columns. The matrix array of pixels 302 occupies at least a portion of the above-mentioned light-receiving surface of imaging device 120. Each of pixels 302 may typically include two or more subpixels, e.g., as described in more detail below in reference to FIGS. 4A-4B. Some of the different subpixels of a same individual pixel 302 may differ, e.g., in the respective sensitivities to different colors of light, the manners in which they are connected or not connected to arbiter 330, the manners in which they are driven by drive circuit 310, and/or the manners in which they are accessed by external circuits. In an example embodiment, pixel array unit 300 may have a size in which pixels 302 are arranged in 1280 columns and 720 rows. In other embodiments, other array sizes may also be used.

In operation, subpixels of pixels 302 may generate electrical charges in response to received light. Drive circuit 320 may apply drive signals (e.g., voltages) to pixels 302 and sub-pixels thereof to enable pixels/subpixels to accumulate the charges and then output corresponding electrical signals to column ADC circuit 340. Arbiter 330 may be used for the EVS mode, where the acronym EVS stands for "event-based vision sensor." More specifically, arbiter 330 may operate to arbitrate requests from different pixels 302 to cause event-triggered readout therefrom to be performed in the order of occurrence of the corresponding events. Column ADC circuit 340 may operate to convert the received analog electrical signals into digital form and direct resulting digital signals 318 to signal-processing unit 320. Signal-processing unit 320 may operate to execute appropriate signal processing, such as correlated double sampling (CDS) processing, white balance adjustment, etc. Resulting processed signals 122 and addresses of event-triggered pixels may then be provided to recording unit 130 (also see FIG. 1).

Some embodiments disclosed herein may benefit from at least some EVS features disclosed, e.g., in U.S. Pat. No. 11,195,869, which is incorporated herein by reference in its entirety.

Figure 4A:
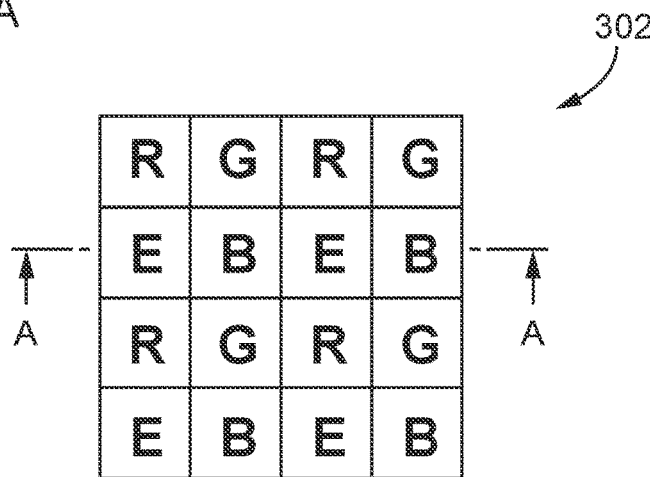
FIGS. 4A-4B illustrate an individual pixel of the IC assembly of FIG. 2 according to an embodiment.
Figure 4B:
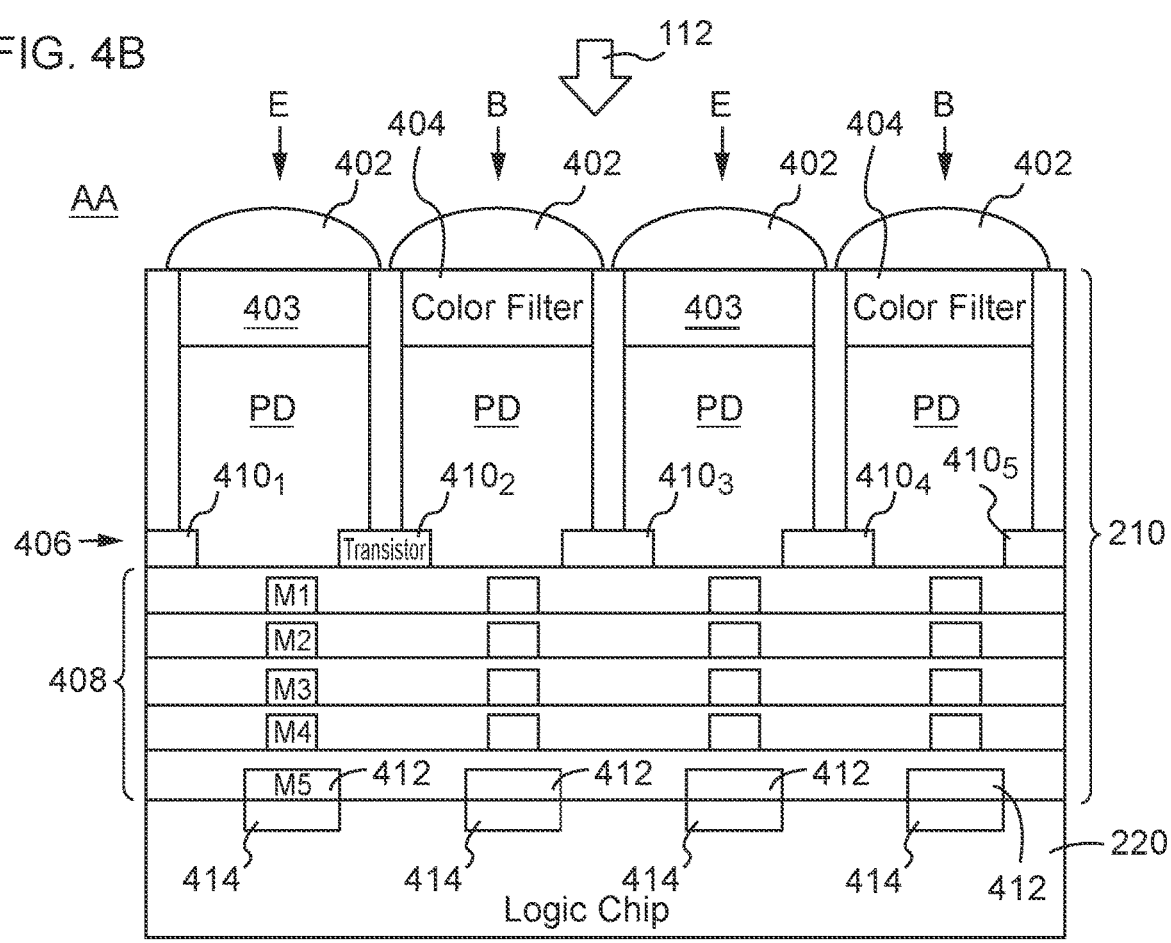

FIGS. 4A-4B illustrate an individual pixel 302 according to an embodiment. More specifically, FIG. 4A shows a schematic plan view of pixel 302. FIG. 4B shows a cross-sectional side view of assembly 200 corresponding to a vertical cross-section plane AA marked in FIG. 4A.

Referring to FIG. 4A, pixel 302 comprises sixteen subpixels arranged in a 4×4 two-dimensional matrix array, i.e., in four rows and four columns. The subpixels include: (i) four EVS subpixels, labeled E; and (ii) twelve imaging subpixels, labeled R, G, B. Differently labeled imaging subpixels have different color filters, e.g., in accordance with the conventional RGB color scheme. In alternative embodiments, other color schemes (e.g., CMY, etc.) known to persons of ordinary skill in the pertinent art may also be used.

The sixteen subpixels E, R, G, B of pixel 302 are arranged in four groups of four subpixels each. Each of the groups has exactly one of each of the E, R, G, and B subpixels arranged in a 2×2 array and is located in the respective one of the four quadrants of pixel 302. In the shown embodiment, each of the groups has an identical arrangement and orientation of the subpixels, e.g., can be viewed as having a respective copy of the same 2×2 ERGB subpixel array. In an alternative embodiment, some of the groups may differ from one another, e.g., in the relative order and/or position of the E, R, G, B subpixels therein. In some alternative embodiments, pixel 302 may include a different number of subpixels and/or groups of subpixels.

Referring to FIG. 4B, each of the subpixels of pixel 302 may have a respective optional lens 402 disposed adjacent and along a main surface of light-receiving chip 210. Rear deep trench isolation (RDTI) is used at subpixel borders, as indicated in FIG. 4B, to physically separate and laterally surround the photodiodes (PDs) of adjacent subpixels. Red, green, and blue color filters 404 may be located between a top surface of the corresponding PD and a bottom surface of the corresponding lens 402 in the R, G, and B subpixels, respectively. In the shown cross-section, only the blue filters 404 are visible. Corresponding spaces 403 in the E subpixels may not have any color filters therein and may be filled by a suitable optically transparent, colorless filler material, e.g., silicon oxide.

On-chip transistors $410_i$ (where i=1, 2, . . . , 5, . . . ) of light-receiving chip 210 are located in a device layer 406 of the chip, typically near the buried edges of the RDTI structures thereof. A metal interconnect structure 408 of light-receiving chip 210 is used to appropriately electrically connect the PDs and transistors $410_i$ and also to route electrical connections between various circuit elements of light-receiving chip 210 and logic chip 220.

For illustration purposes and without any implied limitations, metal interconnect structure 408 is shown in FIG. 4B as having five vertically offset metal levels, labeled M1-M5. In an alternative embodiment, a different (from five) number of such vertically offset metal levels may similarly be used in light-receiving chip 210. Spaces between different electrical conductors of the metal levels M1-M5 are typically filled with inter-level dielectric (ILD), e.g., as known in the pertinent art. ILD layers may have metal-filled vias therein to provide intended electrical connections between selected conductors of different metal levels of metal interconnect structure 408.

The M5 level of metal interconnect structure 408 is illustratively shown as having a plurality of metal pads 412 mated with a corresponding plurality of metal pads 414 of logic chip 220 to provide electrical connections between the chips.

Figure 5:
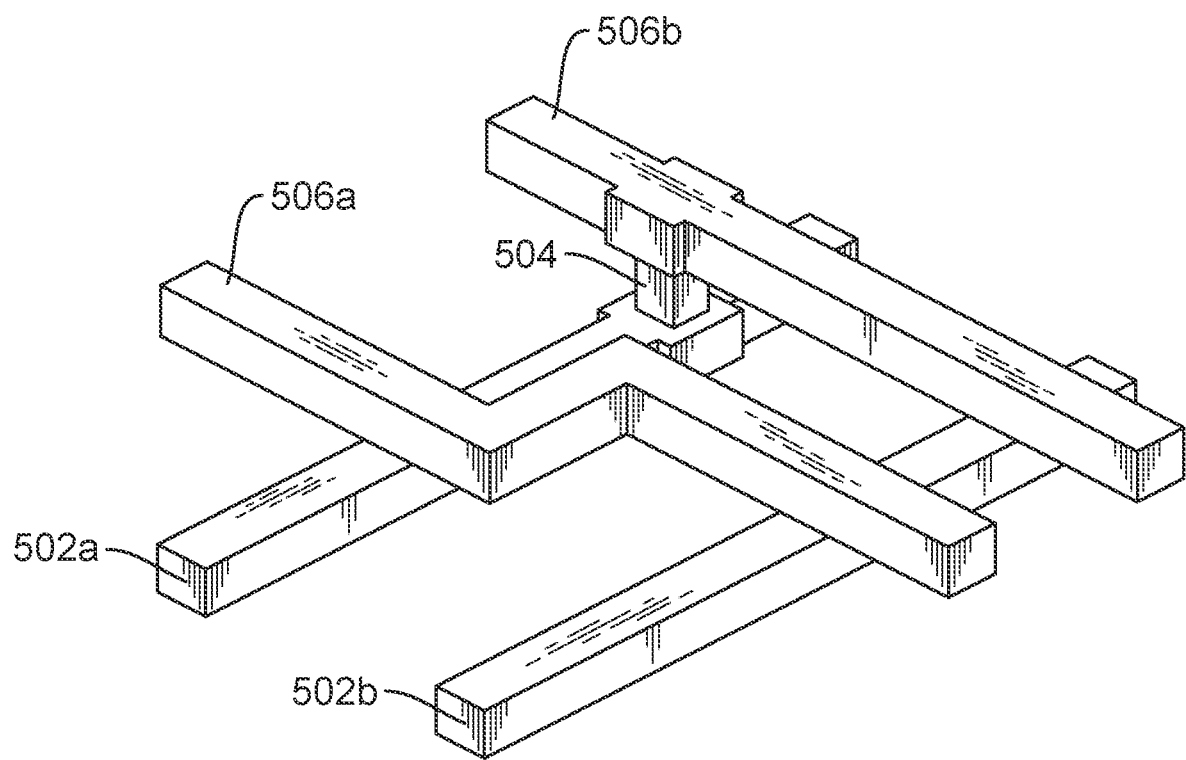
FIG. 5 shows a perspective three-dimensional cutout view of a portion of a metal interconnect structure of the IC assembly of FIG. 2 according to an embodiment.

FIG. 5 shows a perspective three-dimensional cutout view of a portion 500 of interconnect structure 408 according to an embodiment. Portion 500 includes conductors 502a and 502b of metal level Mn and conductors 506a and 506b of metal level M(n+1), where n can be 1, 2, 3, or 4. The corresponding ILD layers are not explicitly shown in FIG. 5 for better clarity of depiction.

As shown, conductors 504a,b and 506a,b are substantially planar, horizontal metal tracks. In general, some of such metal tracks of interconnect structure 408 may have L-shaped turns, e.g., similar to that of conductor 506a. Some of the metal tracks, such as that of the Mn-level conductor 502a and that of the M(n+1)-level conductor 506b, may be directly electrically connected to one another using one or more metal-filled, vertical vias, such as a via 504. Some of such metal-filled, vertical vias (not explicitly shown in FIG. 5) may span more than two metal levels of interconnect structure 408 and be implemented as a stack of vias corresponding to individual levels of the structure.

Figure 6A:
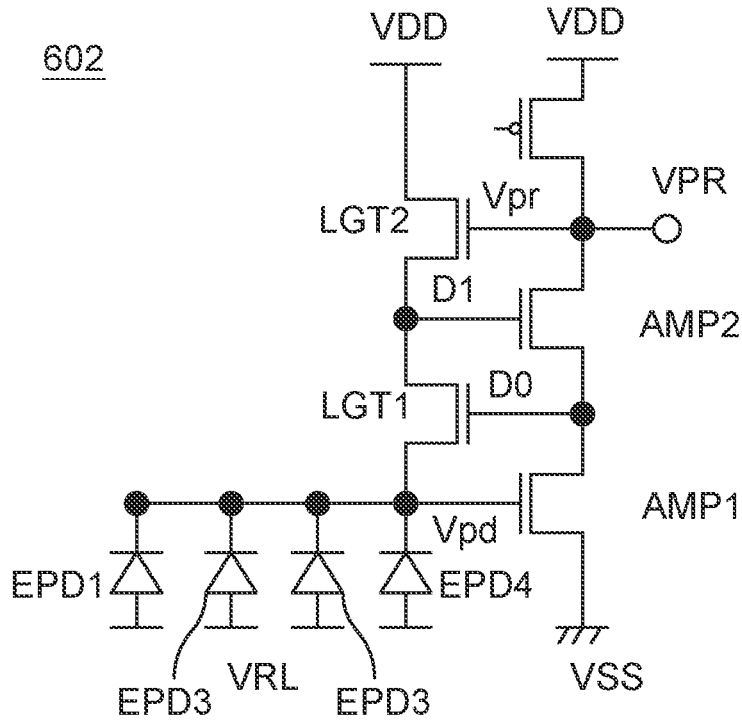
FIGS. 6A-6B show circuit diagrams of example on-chip electrical circuits that can be implemented in the light-receiving chip of the IC assembly of FIG. 2 according to an embodiment.
Figure 6B:
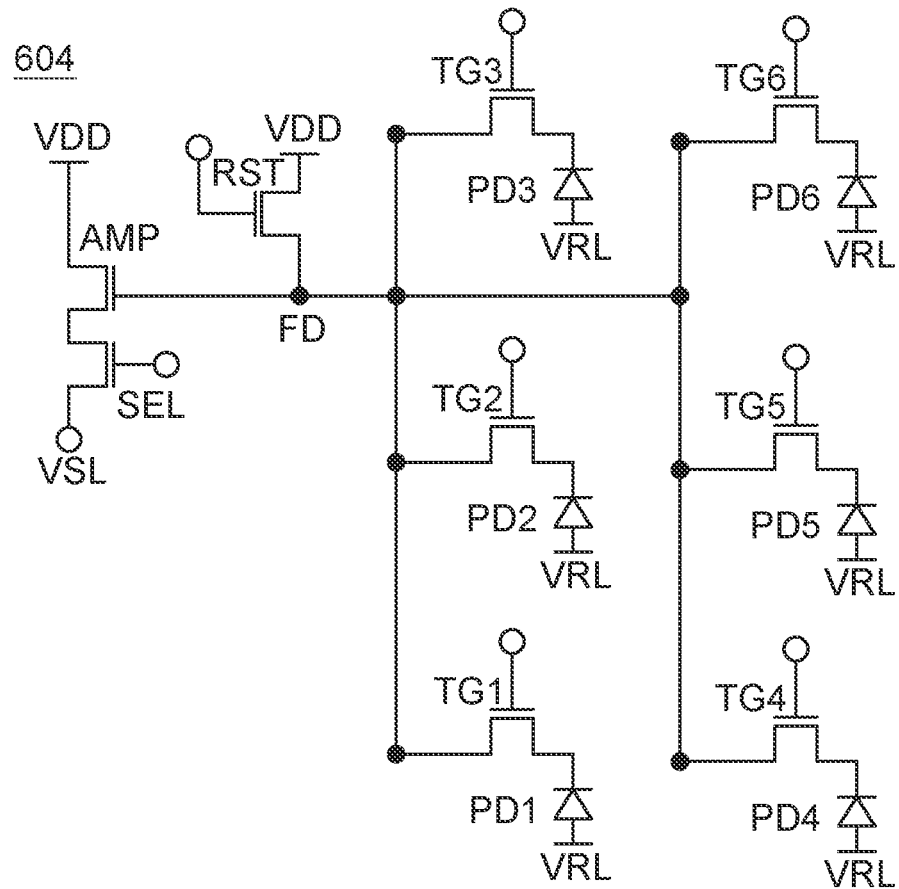

FIGS. 6A-6B show circuit diagrams of example on-chip electrical circuits that can be implemented in light-receiving chip 210 according to an embodiment. More specifically, FIG. 6A illustrates a circuit 602 corresponding to the E subpixels of pixel 302. FIG. 6B illustrates a circuit 604 corresponding to a subset of the R, G, B subpixels of pixel 302.

In an example embodiment, pixel 302 may include one instance of circuit 602 and two instances of circuit 604. Various transistors of such circuits 602 and 604 may be implemented using device layer 406 of light-receiving chip 210, e.g., as described in reference to FIG. 4B. At least some electrical connections between various circuit elements of circuit 602 and between various circuit elements of circuit 604 may be implemented using interconnect structure 408 of light-receiving chip 210 (also see FIGS. 4B and 5).

Referring to FIG. 6A, photodiodes EPD1, EPD2, EPD3, and EPD4 of circuit 602 are the photodiodes of the E subpixels of pixel 302 (also see FIGS. 4A-4B). Transistors LGT1, LGT2, AMP1, and AMP2 of circuit 602 are configured to form a logarithmic current-to-voltage conversion circuit for processing the photocurrents generated by photodiodes EPD1-EPD4. The voltage generated by this current-to-voltage conversion circuit appears at a terminal VPR. Terminals VDD, VSS, and VRL are connected to receive fixed supply voltages. The voltage applied to the VRL terminals may be selected such that photodiodes EPD1, EPD2, EPD3, and EPD4 are appropriately (e.g., negatively) biased to perform more-efficient charge separation.

Referring to FIG. 6B, photodiodes PD1, PD2, PD3, PD4, PD5, and PD6 of circuit 604 are the photodiodes of six R, G, B subpixels of pixel 302, which include two R subpixels, two G subpixels, and two B subpixels. Transistors AMP, SEL, and RST are shared by photodiodes PD1-PD6. Transistors TG1-TG6 are connected between individual ones of the photodiodes PD1-PD6 and the gate of transistor AMP. A terminal VSL is a signal-readout terminal. Terminals VDD and VRL of circuit 604 may be connected to receive the same fixed supply voltages as the correspondingly labeled terminals of circuit 602.

Figure 7:
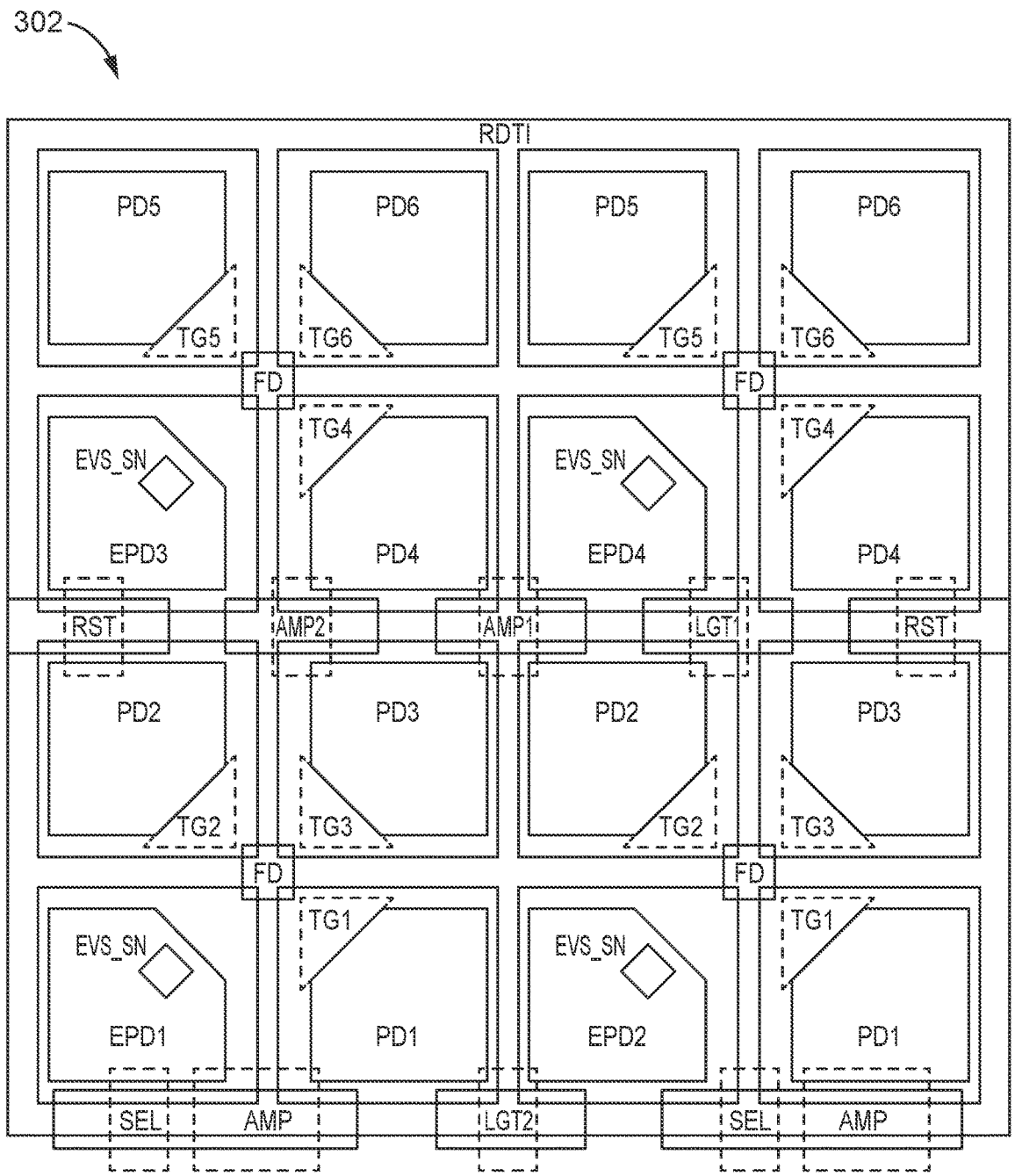
FIG. 7 shows an on-chip circuit layout of an individual pixel of the IC assembly of FIG. 2 according to an embodiment

FIG. 7 shows an on-chip circuit layout of an individual pixel 302 according to an embodiment. More specifically, FIG. 7 shows a plan view of pixel 302, which corresponds to the plan view shown in FIG. 4A. The labeling of different circuit elements in FIG. 7 is the same as in FIGS. 6A-6B. As already indicated above, an individual pixel 302 has one instance of circuit 602 (FIG. 6A) and two instances of circuit 604 (FIG. 6B). The labels FD in FIGS. 6B and 7 denote a floating diffusion layer. The labels EVS_SN in FIG. 7 denote the nodes of photodiodes EPD1-EPD4, which are used for electrically connecting the photodiodes to metal conductors of interconnect structure 408. The label RDTI denotes an RDTI structure of pixel 302, which is used to physically separate different photodiodes of the pixel from each other (also see FIG. 4B).

Manufacturing of light-receiving chip 210 having an array of pixels 302 of FIG. 7 may typically be implemented using two distinct processing stages, which are usually referred to as front-end-of-line (FEOL) processing and back-end-of-line (BEOL) processing.

During the FEOL processing, individual circuit devices, such as transistors, capacitors, resistors, etc., may be patterned and formed using the device layer (see, e.g., layer 406, FIG. 6A) of the corresponding wafer and any needed additional semiconductor layers adjacent thereto. In the context of CMOS processes, FEOL processing typically encompasses fabrication steps directed at forming photodiodes and/or isolated electrical CMOS elements. Such fabrication steps may include but are not limited to: (a) chemical-mechanical planarization (CMP) and cleaning of the wafer; (b) patterning the device layer; (c) trench isolation, e.g., RSTI; (d) well formation; (e) gate formation; (f) source and drain module formation, etc.

During the BEOL processing, the individual circuit devices formed during the FEOL processing may be electrically interconnected by forming an appropriate metal interconnect structure, e.g., 408, FIG. 4B. For example, contact pads, interconnect wires, vias, and various ILD layers may be formed. Example BEOL fabrication steps may include but are not limited to: (g) silicidation of source, drain, and poly-silicon regions; (h) forming and patterning various dielectric layers, some of which may be used as optical cladding; (i) forming and patterning various metal layers, e.g., to produce metal levels M1-M5, FIG. 4B; (j) making vias, e.g., 504, FIG. 5; (k) forming passivation layers, etc.

After the BEOL processing, the wafer may be subjected to post-fabrication processing. Such processing may include but is not limited to wafer testing, wafer-back grinding, dicing, die testing, and chip packaging. In contrast to the FEOL and BEOL processing, at least some of the steps of the post-fabrication processing may be performed outside the clean-room environment.

Circuits 602 and 604 may typically be operated using different operating modes of imaging device 120. For example, as already mentioned above, circuits 602 may be used in an EVS operating mode, in which the E subpixels of different pixels 302 may be continuously in the ON state, and arbiter 330 may arbitrate event-triggered requests from different pixels 302 for signal readout from the E subpixels thereof. In contrast, circuits 604 may be used for image-frame capture, wherein the R, G, and B subpixels of different pixels 302 may operate under control of the frame-capture circuitry of imaging device 120. Thus, in some situations, circuits 602 and 604 of the same pixel 302 may be active at the same time. In such situations, signals generated in circuits 602 and 604 may interfere and interact with each other, e.g., by way of electromagnetic crosstalk phenomena, thereby possibly causing the quality of images generated in both EVS and image-frame-capture modes to be detrimentally affected.

Various embodiments disclosed hereinbelow are generally directed at reducing such interferences and interactions. For example, according to one possible embodiment, a significant inter-mode interference reduction in imaging device 120 may be achieved by using a metal interconnect structure 408 of light-receiving chip 210 specifically designed to reduce the above-mentioned crosstalk, by optimizing (e.g., minimizing) the spatial overlap, within pixel 302, between the metal wirings corresponding to circuits 602 and 604. This and other pertinent features of various embodiments of such metal interconnect structure 408 are described in more detail below in reference to FIGS. 8-11. The described embodiments may beneficially improve the quality of images produced in both EVS and image-frame-capture operating modes of imaging device 120 due to relatively low levels of inter-mode interferences and interactions therein.

Each of FIGS. 8-11 illustrates a respective embodiment using a transparent plan view of metal interconnect structure 408, which makes the on-chip circuit layout of pixel 302 (also see FIG. 7) visible. The XY-coordinate plane in FIGS. 8-11 represents a "main plane" of light-receiving chip 210, as defined above. The Z-coordinate axis represents the "vertical" direction, as defined above. Conductors of only some of metal levels M1-M5 of interconnect structure 408 are shown in FIGS. 8-11 for clarity. FIGS. 8-11 are described below in continued reference to the circuit diagrams shown in FIGS. 6A-6B.

Figure 8:
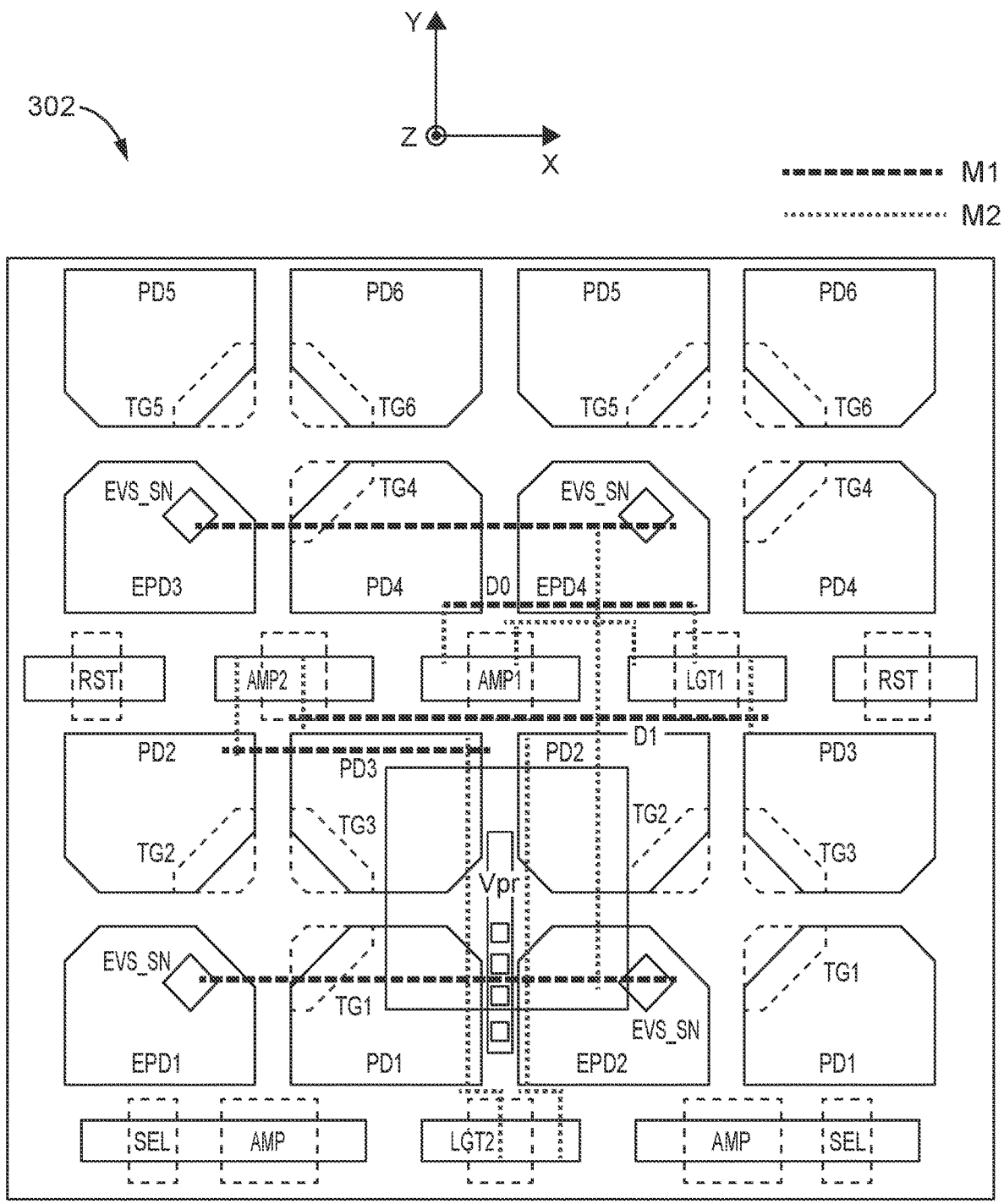
FIG. 8 shows an on-chip wiring layout of an individual pixel of the IC assembly of FIG. 2 according to an embodiment.

FIG. 8 illustrates an on-chip wiring layout of an individual pixel 302 according to an embodiment. Only the conductors of metal levels M1 and M2 are explicitly shown in FIG. 8 for clarity. Also explicitly shown in FIG. 8 is a VPR terminal of circuit 602 (also see FIG. 6A). This VPR terminal is implemented as a rectangular pad in metal level M4 of interconnect structure 408.

In an example embodiment, conductors of metal level M1 run primarily parallel to the X-coordinate axis, i.e., oriented to have their longitudinal direction parallel to the X-coordinate axis. Conductors of metal level M2 run primarily parallel to the Y-coordinate axis. Herein, the term "primarily" means that more than 50% (and preferably more than 75%) of the total conductor length in the indicated metal level has the indicated orientation.

Due to their mutually orthogonal orientations, the conductors of metal levels M1 and M2 form a substantially rectangular metal mesh vertically below the photodiodes of pixel 302. Herein, the term "below" is used with respect to the vertical propagation direction of incident light 112 (also see FIG. 4B). More specifically, in this context, "below" means in the downstream direction, and "above" means in the upstream direction.

In an example embodiment, the conductors of metal levels M1 and M2 may be configured such that the corresponding metal mesh has approximately the same (e.g., within 10-15%) effective fill factor in the areas thereof vertically below the different ones of photodiodes EPD1-EPD4 and PD1-PD6. As a result, such mesh may provide similar levels of optical reflection, scattering, and shielding for different subpixels of pixel 302, which may be beneficial for attaining a better image quality.

In FIG. 8, dashed lines indicate some of the pertinent conductors of the levels M1 and M2 used to implement the electrical connections of circuit 602. For example, an electrical connection DO (also see FIG. 6A), which connects the gate of transistor LGT1 to transistors AMP1 and AMP2, has a relatively long segment in metal level M1 and relatively short segments in metal level M2. An electrical connection D1 (also see FIG. 6A), which connects the gate of transistor AMP2 to transistors LGT1 and LGT2, has relatively long segments in both metal levels M1 and M2. Electrical connection Vpr (also see FIG. 6A), which connects the gate of transistor LGT2 to transistor AMP2, similarly has relatively long segments in both metal levels M1 and M2. The VPR terminal (the large rectangular pad in FIG. 8), which is located in metal level M4, is connected to one or more segments of the electrical connection Vpr in metal levels M1/M2 using a vertical stack of metal-filled vias. Four sensor nodes EVS_SN are connected pairwise using relatively long conductors in the metal level M1. The resulting two connected EVS_SN node pairs are connected to each other using a relatively long conductor in level M2. The latter relatively long conductor is further connected: (i) to the gate of transistor AMP1, using a relatively short conductor in metal level M2, which implements electrical connection Vpd (also see FIG. 6A); and (ii) to transistor LGT1 using another relatively short conductor in metal level M2.

The above-indicated configuration of the Vpr and Vpd connections may cause the corresponding associated capacitances (hereafter, Cpr and Cpd, respectively) to be relatively low, which is beneficial for realizing a fast EVS-mode response of pixel 302. Furthermore, a specific layout of the Vpr and Vpd connections can be selected such that the Cpr/Cpd ratio is approximately 0.3, e.g., between 0.2 and 0.4, which is beneficial for achieving a relatively stable transfer function for the current-to-voltage converter of circuit 602 under various operating conditions.

Note that the above-described wiring of circuit 602 in levels M1 and M2 is clustered primarily in the portion of interconnect structure 408 that is vertically below a middle section of the footprint of pixel 302 on the light-receiving surface of light-receiving chip 120 in assembly 200 (also see FIG. 4B). In contrast, the wirings of the two instances of circuit 604 in levels M1 and M2 are distributed primarily in other portions of interconnect structure 408, e.g., the portions that are primarily vertically below the peripheral sections of said footprint of pixel 302, which do not spatially overlap with the footprint of the middle section. This feature of interconnect structure 408 may be beneficial for inhibiting the inter-mode crosstalk, as explained above.

Figure 9:
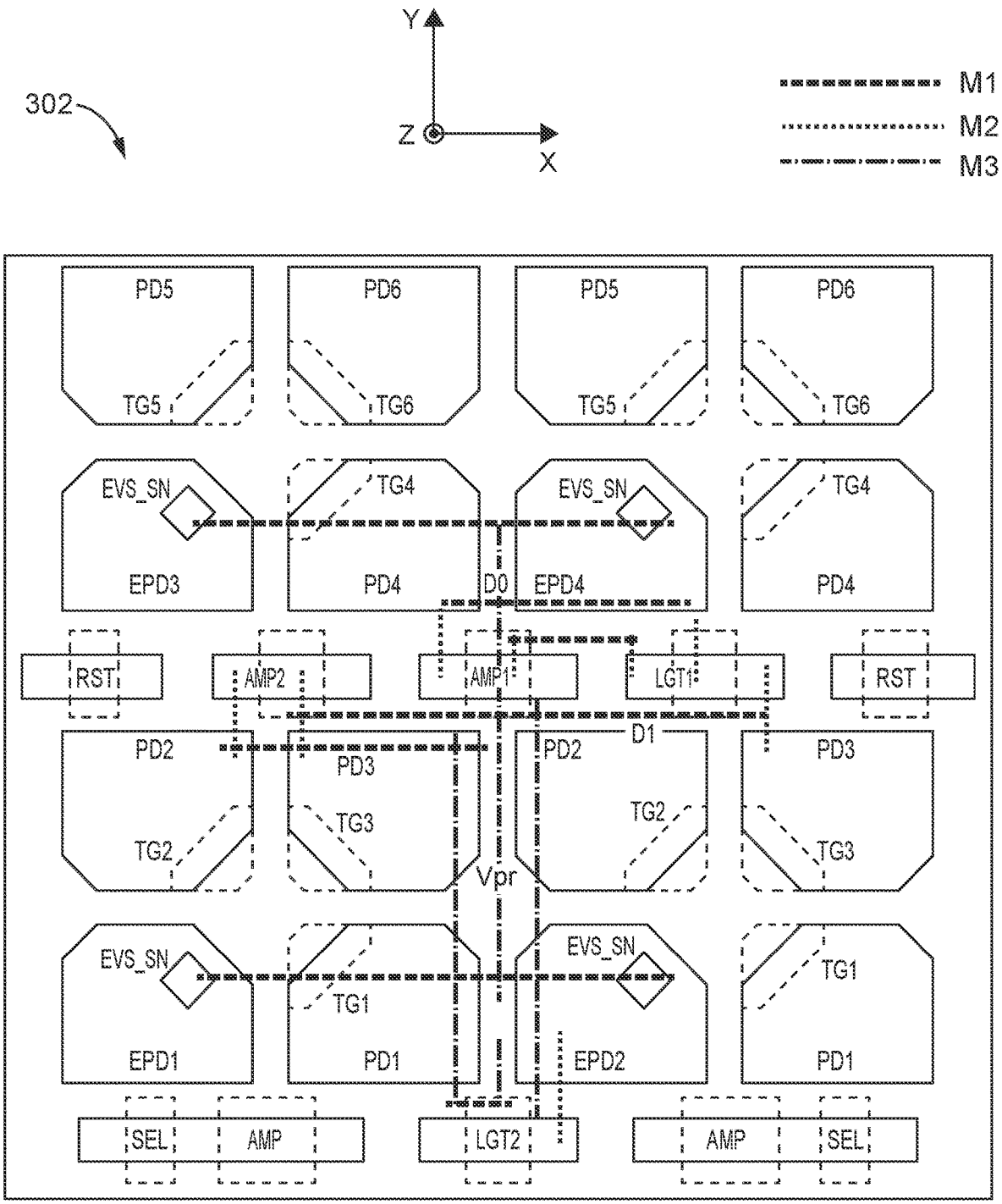
FIG. 9 shows an on-chip wiring layout of an individual pixel of the IC assembly of FIG. 2 according to another embodiment.

FIG. 9 illustrates an on-chip wiring layout of an individual pixel 302 according to another embodiment. FIG. 9 can be better understood in comparison with FIG. 8. As such, the description of FIG. 9 mainly focuses on differences between the embodiments of FIGS. 8 and 9. The VPR terminal of circuit 602 (also see FIGS. 6A, 8), which is implemented as a rectangular pad in metal level M4, is not explicitly shown in FIG. 9.

In the embodiment of FIG. 9, at least one of the relatively long segments of the electrical connection D1 is located in the metal level M3. For comparison, in the embodiment of FIG. 8, the corresponding portions of the electrical connection D1 are located in the metal level M2.

In the embodiment of FIG. 9, at least some of the relatively long segments of the electrical connection Vpr are located in metal level M3. For comparison, in the embodiment of FIG. 8, the corresponding portions of the electrical connection Vpr are located in the metal level M2.

In the embodiment of FIG. 9, the two connected EVS_SN node pairs are connected to each other using a relatively long conductor in the metal level M3. For comparison, in the embodiment of FIG. 8, the same electrical connection is implemented in the metal level M2.

Implementation of these changes may help to further inhibit the inter-mode crosstalk between circuits 602 and 604 of pixel 302 by increasing the effective physical separation between the wirings of these circuits within interconnect structure 408. However, this improvement may come with the associated cost of additional complexities in the BEOL manufacturability of interconnect structure 408, as more-complex via stacks may be present therein.

Figure 10:
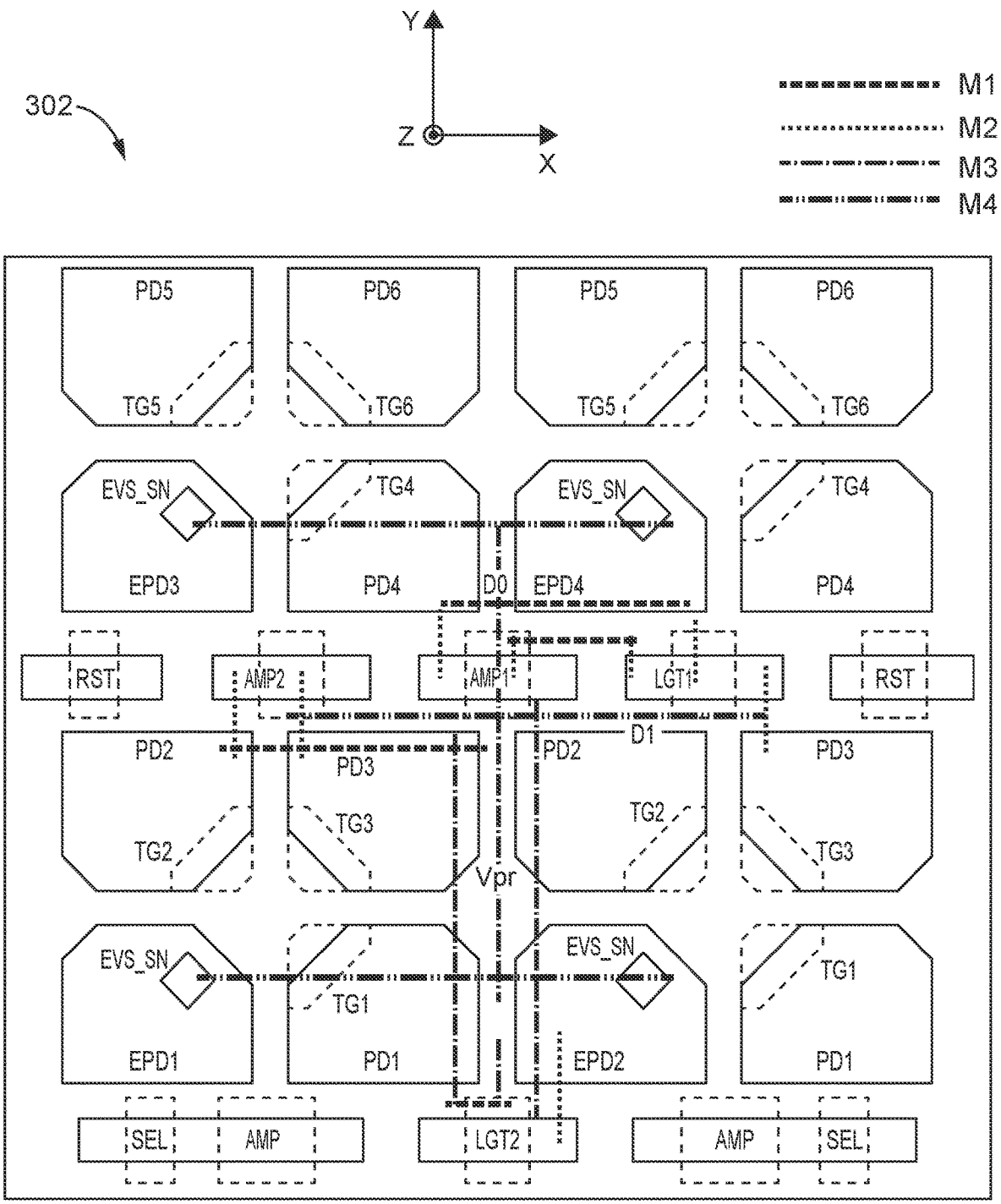
FIG. 10 shows an on-chip wiring layout of an individual pixel of the IC assembly of FIG. 2 according to yet another embodiment.

FIG. 10 illustrates an on-chip wiring layout of an individual pixel 302 according to yet another embodiment. FIG. 10 can be better understood in comparison with FIG. 9. As such, the description of FIG. 10 mainly focuses on differences between the embodiments of FIGS. 9 and 10.

In the embodiment of FIG. 10, another one of the relatively long segments of the electrical connection D1 is now located in the metal level M4. For comparison, in the embodiment of FIG. 9, the corresponding portion of the electrical connection D1 is located in the metal level M1.

In the embodiment of FIG. 10, the four sensor nodes EVS_SN are connected pairwise using relatively long conductors in the metal level M4. For comparison, in the embodiment of FIG. 9, the four sensor nodes EVS_SN are connected pairwise using relatively long conductors in the metal level M1.

Implementation of these further changes may help to even further inhibit the inter-mode crosstalk between circuits 602 and 604 of pixel 302 by further increasing the effective physical separation between the wirings of these circuits in interconnect structure 408. However, this improvement may come with the associated cost of further complexities in the BEOL manufacturability of interconnect structure 408, as even more of relatively complex via stacks may be present therein.

Figure 11:
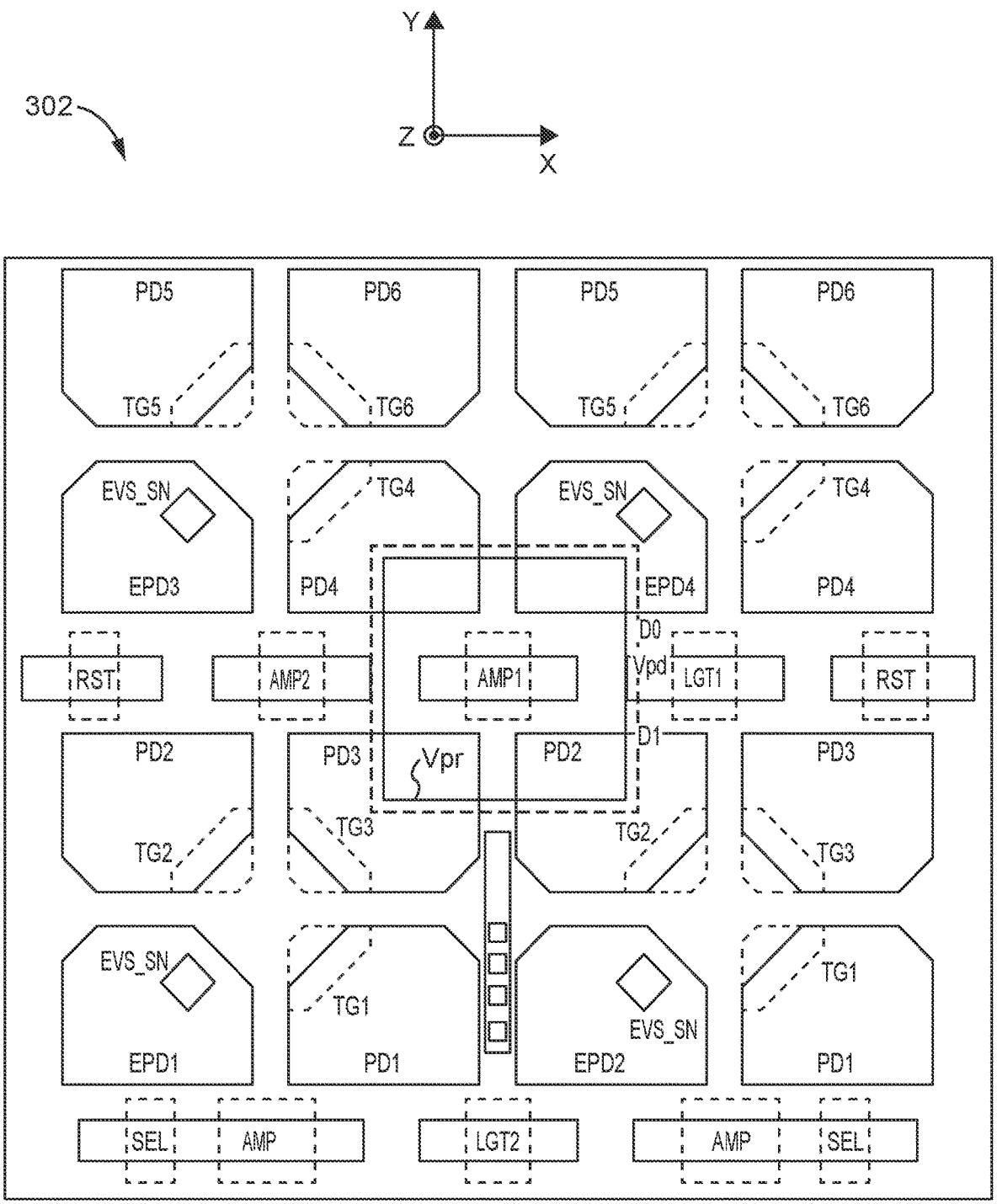
FIG. 11 shows an on-chip wiring layout of an individual pixel of the IC assembly of FIG. 2 according to yet another embodiment.

FIG. 11 illustrates an on-chip wiring layout of an individual pixel 302 according to yet another embodiment. FIG. 11 can be better understood in comparison with FIG. 8. Such a comparison immediately reveals different respective locations, in the embodiments of FIGS. 8 and 11, of the rectangular metal pad of terminal VPR in metal level M4.

In the embodiment of FIG. 11, the metal pad of terminal VPR has portions thereof located vertically below each of the four quadrants of the light-receiving surface of pixel 302. For example, said metal pad has portions thereof located vertically below the geometric center of the light-receiving surface of pixel 302. For a rectangular pixel shape, the geometric center is at the intersection of the two diagonals of the shape. In contrast, in the embodiment of FIG. 8, the metal pad of terminal VPR has portions thereof located vertically below only two of the four quadrants of the light-receiving surface of pixel 302.

A change in the location of the metal pad of terminal VPR may be used, e.g., to optimize the above-mentioned Cpr/Cpd ratio. However, some care may be needed in the implementation of such change, as some locations of the metal pad may produce a relatively high Cpr capacitance, which may detrimentally increase the effective response time of pixel 302 in the EVS operating mode.

In some embodiments, further optimization of pixel 302 may be implemented using one or more of the following: (i) changing the sizes of one or more of the EVS_SN nodes; (ii) changing (e.g., reducing) the amount of level-M1 metal connected to the EVS_SN nodes; (iii) using heavy doping of device layer 406 to make conductors therein for electrically connecting some of the on-chip transistors of pixel 302 while removing the corresponding conductors from metal interconnect structure 408; and (iv) changing the relative locations of (e.g., increasing the distances between) the EVS_SN nodes and FD layers of pixel 302.

According to an example embodiment disclosed above, e.g., in the summary section and/or in reference to any one or any combination of some or all of FIGS. 1-11, provided is an apparatus comprising: a first electronic chip (e.g., 210, FIG. 2) having an array (e.g., 300, FIG. 3) of photosensitive pixels (e.g., 302, FIG. 3) along a light-receiving surface thereof, wherein a pixel of the array comprises: one or more first photodiodes (e.g., EPD1-EPD4, FIG. 7) and one or more second photodiodes (e.g., PD1-PD6, FIG. 7); first and second transistors (e.g., LGT1, LGT2, AMP1, AMP2, FIG. 6A; AMP, SEL, RST, TG1-TG6; FIG. 6B); and an interconnect structure (e.g., 408, FIG. 4B) vertically below the first and second photodiodes and the first and second transistors, the interconnect structure including first electrical conductors interconnecting the one or more first photodiodes and the first transistors to form a first electrical circuit (e.g., 602, FIG. 6A) and further including second electrical conductors interconnecting the one or more second photodiodes and the second transistors to form a second electrical circuit (e.g., 604, FIG. 6B), the first and second electrical circuits being functionally different and independent from each other; wherein the first electrical conductors are arranged substantially in a portion of the interconnect structure vertically below a first area of the light-receiving surface in the pixel; and wherein the second electrical conductors are arranged substantially in a portion of the interconnect structure vertically below a second area of the light-receiving surface in the pixel, the second area non-overlapping with the first area.

Herein, the term "substantially" should be interpreted to mean that more than a fixed percentage of the metal wiring in the recited "portion of the interconnect structure" is of the recited type, i.e., "first electrical conductors" or "second electrical conductors." Depending on the embodiment, the fixed percentage can be, e.g., 50%, 33.3%, or other appropriate threshold value. For example, for a pixel having two different circuits of approximately the same size, the threshold can be 50% or in some cases 75%. For a pixel having three different circuits of approximately the same size, the threshold can be 33.3% or in some cases 50%. In general, such threshold can be determined in a relatively straightforward manner based on the number and relative size of the circuits in the pixel. For example, with three circuits of approximately the same size, the uniformly distributed wiring will result in 33% of the individual-circuit wiring in any ⅓-sized portion of the metal interconnect. In contrast, according to an example embodiment, the per-circuit wiring shares in such ⅓-sized portion can be, e.g., 50:25:25, 25:50:25, and 25:25:50, respectively. Such selective wiring localization may be advantageous for at least some of the reasons already explained above.

In some embodiments of the above apparatus, the pixel further comprises an RDTI structure (e.g., RDTI, FIGS. 4B, 7) individually laterally surrounding each of the first and second photodiodes; and wherein at least some of the first and second transistors are vertically below and adjacent to buried edges of the RDTI structure (e.g., as indicated in FIGS. 4B, 7).

In some embodiments of any of the above apparatus, the pixel further comprises a plurality of color filters (e.g., 404, FIG. 4B), each of the color filters being vertically above a respective one of the second photodiodes.

In some embodiments of any of the above apparatus, the pixel further comprises a plurality of lenses (e.g., 402, FIG. 4B), each of the lenses being vertically above a respective one of the first and second photodiodes.

In some embodiments of any of the above apparatus, the interconnect structure comprises a vertical stack of metal levels (e.g., M1-M5, FIG. 4B).

In some embodiments of any of the above apparatus, the first electrical conductors are present in two different metal levels (e.g., M1, M2, FIG. 8) of the vertical stack.

In some embodiments of any of the above apparatus, the first electrical conductors are present in three different metal levels (e.g., M1, M2, M3, FIG. 9) of the vertical stack.

In some embodiments of any of the above apparatus, the first electrical conductors are present in four different metal levels (e.g., M1, M2, M3, M4, FIG. 10) of the vertical stack.

In some embodiments of any of the above apparatus, most of electrical conductors of a topmost metal level (e.g., M1, FIG. 8) of the stack are oriented parallel to a first direction within a main plane of the first electronic chip; and wherein most of electrical conductors of a next topmost metal level (e.g., M2, FIG. 8) of the stack are oriented parallel to a second direction within the main plane, the second direction being orthogonal to the first direction.

In some embodiments of any of the above apparatus, the electrical conductors of the topmost and next topmost metal levels are arranged to provide an approximately uniform metal fill vertically below the first and second photodiodes.

In some embodiments of any of the above apparatus, the interconnect structure includes a metal pad in a bottom level (e.g., M4, FIGS. 8, 11) of the stack, the metal pad being configured as an output terminal (e.g., VPR, FIG. 6A) of the first circuit.

In some embodiments of any of the above apparatus, the metal pad has portions thereof vertically below four different ones of the first and second photodiodes (e.g., as in FIGS. 8, 11).

In some embodiments of any of the above apparatus, the metal pad has a portion thereof vertically below a geometric center of the light-receiving surface in the pixel (e.g., as in FIG. 11).

In some embodiments of any of the above apparatus, the first circuit comprises a logarithmic current-to-voltage converter (FIG. 6A); and wherein the second circuit comprises a floating diffusion layer (e.g., FD, FIGS. 6B, 7).

In some embodiments of any of the above apparatus, the first circuit includes four of the first photodiodes.

In some embodiments of any of the above apparatus, the second circuit includes six of the second photodiodes.

In some embodiments of any of the above apparatus, the pixel includes two instances of the second circuit.

In some embodiments of any of the above apparatus, the apparatus further comprises a second electronic chip (e.g., 220, FIG. 2) attached to the interconnect structure to form a vertical chip stack (e.g., 200, FIG. 2), the second electronic chip including circuitry electrically connected to the first and second circuits by way of the interconnect structure.

In some embodiments of any of the above apparatus, the circuitry is configured to operate the first circuit using a first operating mode (e.g., EVS mode) and further configured to operate the second circuit using a functionally different second operating mode (e.g., image-frame-capture mode).

In some embodiments of any of the above apparatus, the circuitry is configurable to operate the first and second circuits by simultaneously running the first and second operating modes.

According to another example embodiment disclosed above, e.g., in the summary section and/or in reference to any one or any combination of some or all of FIGS. 1-11, provided is a manufacturing method, comprising the steps of: (A) fabricating an electronic chip (e.g., 210, FIG. 2) having an array (e.g., 300, FIG. 3) of photosensitive pixels (e.g., 302, FIG. 3) along a light-receiving surface thereof, wherein a pixel of the array comprises: one or more first photodiodes (e.g., EPD1-EPD4, FIG. 7) and one or more second photodiodes (e.g., PD1-PD6, FIG. 7); and first and second transistors (e.g., LGT1, LGT2, AMP1, AMP2, FIG.

6A; AMP, SEL, RST, TG1-TG6; FIG. 6B); and (B) forming an interconnect structure (e.g., 408, FIG. 4B) vertically below the first and second photodiodes and the first and second transistors, the interconnect structure including first electrical conductors interconnecting the one or more first photodiodes and the first transistors to form a first electrical circuit (e.g., 602, FIG. 6A) and further including second electrical conductors interconnecting the one or more second photodiodes and the second transistors to form a second electrical circuit (e.g., 604, FIG. 6B), the first and second electrical circuits being functionally different and independent from each other, wherein the step of forming comprises the sub-steps of: (B1) arranging the first electrical conductors substantially in a portion of the interconnect structure vertically below a first area of the light-receiving surface in the pixel; and (B2) arranging the second electrical conductors substantially in a portion of the interconnect structure vertically below a second area of the light-receiving surface in the pixel, the second area non-overlapping with the first area.

While this disclosure includes references to illustrative embodiments, this specification is not intended to be construed in a limiting sense. Various modifications of the described embodiments, as well as other embodiments within the scope of the disclosure, which are apparent to persons of ordinary skill in the art to which the disclosure pertains are deemed to lie within the scope of the disclosure, e.g., as expressed in the following claims.

Some embodiments may be implemented as circuit-based processes, including possible implementation on a single integrated circuit.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain the nature and principles of this disclosure may be made by those skilled in the pertinent art without departing from the scope of the disclosure, e.g., as expressed in the following claims.

The use of figure numbers and/or figure reference labels (if any) in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three dimensional structure as shown in the figures. Such "height" would be vertical where the electrodes are horizontal but would be horizontal where the electrodes are vertical, and so on. Similarly, while some of the figures show different layers as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

It should be appreciated by those of ordinary skill in the art that any block diagrams herein represent conceptual views of illustrative circuitry embodying the principles of the disclosure.

"SUMMARY OF SOME SPECIFIC EMBODIMENTS" in this specification is intended to introduce some example embodiments, with additional embodiments being described in "DETAILED DESCRIPTION" and/or in reference to one or more drawings. "SUMMARY OF SOME SPECIFIC EMBODIMENTS" is not intended to identify essential elements or features of the claimed subject matter, nor is it intended to limit the scope of the claimed subject matter.

What is claimed is:

1. An apparatus, comprising a first electronic chip having an array of photosensitive pixels along a light-receiving surface thereof, wherein a pixel of the array comprises:
   one or more first photodiodes and one or more second photodiodes;
   first and second transistors; and
   an interconnect structure vertically below the first and second photodiodes and the first and second transistors, the interconnect structure including first electrical conductors interconnecting the one or more first photodiodes and the first transistors to form a first electrical circuit and further including second electrical conductors interconnecting the one or more second photodiodes and the second transistors to form a second electrical circuit, the first and second electrical circuits being functionally different and independent from each other;
   wherein the first electrical conductors are arranged substantially in a portion of the interconnect structure vertically below a first area of the light-receiving surface in the pixel; and
   wherein the second electrical conductors are arranged substantially in a portion of the interconnect structure vertically below a second area of the light-receiving surface in the pixel, the second area non-overlapping with the first area.

2. The apparatus of claim 1,
   wherein the pixel further comprises an RDTI structure individually laterally surrounding each of the first and second photodiodes; and
   wherein at least some of the first and second transistors are vertically below and adjacent to buried edges of the RDTI structure.

3. The apparatus of claim 1, wherein the pixel further comprises a plurality of color filters, each of the color filters being vertically above a respective one of the second photodiodes.

4. The apparatus of claim 1, wherein the pixel further comprises a plurality of lenses, each of the lenses being vertically above a respective one of the first and second photodiodes.

5. The apparatus of claim 1, wherein the interconnect structure comprises a vertical stack of metal levels.

6. The apparatus of claim 5, wherein the first electrical conductors are present in two different metal levels of the vertical stack.

7. The apparatus of claim 5, wherein the first electrical conductors are present in three different metal levels of the vertical stack.

8. The apparatus of claim 5, wherein the first electrical conductors are present in four different metal levels of the vertical stack.

9. The apparatus of claim 5,
   wherein most of electrical conductors of a topmost metal level of the stack are oriented parallel to a first direction within a main plane of the first electronic chip; and
   wherein most of electrical conductors of a next topmost metal level of the stack are oriented parallel to a second direction within the main plane, the second direction being orthogonal to the first direction.

10. The apparatus of claim 9, wherein the electrical conductors of the topmost and next topmost metal levels are arranged to provide an approximately uniform metal fill vertically below the first and second photodiodes.

11. The apparatus of claim 5, wherein the interconnect structure includes a metal pad in a bottom level of the stack, the metal pad being configured as an output terminal of the first circuit.

12. The apparatus of claim 11, wherein the metal pad has portions thereof vertically below four different ones of the first and second photodiodes.

13. The apparatus of claim 11, wherein the metal pad has a portion thereof vertically below a geometric center of the light-receiving surface in the pixel.

14. The apparatus of claim 1,
wherein the first circuit comprises a logarithmic current-to-voltage converter; and
wherein the second circuit comprises a floating diffusion layer.

15. The apparatus of claim 1, wherein the first circuit includes four of the first photodiodes.

16. The apparatus of claim 1, wherein the second circuit includes six of the second photodiodes.

17. The apparatus of claim 1, wherein the pixel includes two instances of the second circuit.

18. The apparatus of claim 1, further comprising a second electronic chip attached to the interconnect structure to form a vertical chip stack, the second electronic chip including circuitry electrically connected to the first and second circuits by way of the interconnect structure.

19. The apparatus of claim 18,
wherein the circuitry is configured to operate the first circuit using a first operating mode (and further configured to operate the second circuit using a functionally different second operating mode; and
wherein the circuitry is configurable to operate the first and second circuits by simultaneously running the first and second operating modes.

20. A manufacturing method, comprising:
fabricating an electronic chip having an array of photosensitive pixels along a light-receiving surface thereof, wherein a pixel of the array comprises:
one or more first photodiodes and one or more second photodiodes; and
first and second transistors; and
forming an interconnect structure vertically below the first and second photodiodes and the first and second transistors, the interconnect structure including first electrical conductors interconnecting the one or more first photodiodes and the first transistors to form a first electrical circuit and further including second electrical conductors interconnecting the one or more second photodiodes and the second transistors to form a second electrical circuit, the first and second electrical circuits being functionally different and independent from each other, wherein the forming comprises:
arranging the first electrical conductors substantially in a portion of the interconnect structure vertically below a first area of the light-receiving surface in the pixel; and
arranging the second electrical conductors substantially in a portion of the interconnect structure vertically below a second area of the light-receiving surface in the pixel, the second area non-overlapping with the first area.

* * * * *